United States Patent
Wu et al.

(10) Patent No.: US 8,954,899 B2
(45) Date of Patent: Feb. 10, 2015

(54) CONTOUR ALIGNMENT SYSTEM

(71) Applicant: Taiwan Semiconductor Manufacturing Company, Ltd., Hsin-Chu (TW)

(72) Inventors: Ping-Chieh Wu, New Taipei (TW); Tzu-Chin Lin, Hsinchu (TW); Hung-Ting Lu, New Taipei (TW); Wen-Chun Huang, Tainan (TW); Ru-Gun Liu, Zhubei (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 13/645,256

(22) Filed: Oct. 4, 2012

(65) Prior Publication Data
US 2014/0101624 A1   Apr. 10, 2014

(51) Int. Cl.
*G06F 17/50* (2006.01)
*G03F 7/00* (2006.01)

(52) U.S. Cl.
CPC . *G06F 17/50* (2013.01); *G03F 7/00* (2013.01)
USPC .......................................................... 716/53

(58) Field of Classification Search
CPC ....... G06F 17/50; G06F 17/5068; G03F 7/00; G03F 1/36; G03F 7/70441; G03F 7/705
USPC ............................... 716/50, 51, 52, 53, 54, 55
See application file for complete search history.

(56) References Cited

U.S. PATENT DOCUMENTS 7,653,892 B1 *   1/2010  Gennari et al. ................. 716/50
2013/0234020 A1 *   9/2013  Ogino et al. ................... 250/307

* cited by examiner

*Primary Examiner* — Vuthe Siek
(74) *Attorney, Agent, or Firm* — Haynes and Boone, LLP (57) ABSTRACT

The present disclosure describes a method of calibrating a contour. The method includes designing an anchor pattern, printing the anchor pattern on a substrate, collecting scanning electron microscope (SEM) data of the printed anchor pattern on the substrate, wherein the SEM data includes a SEM image of the printed anchor pattern on the substrate, converting the SEM image of the printed anchor pattern on the substrate into a SEM contour of the printed anchor pattern, analyzing the SEM contour of the printed anchor pattern, and aligning the SEM contour of the anchor pattern to form the calibrated SEM contour.

20 Claims, 8 Drawing Sheets

CONTOUR ALIGNMENT SYSTEM

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed For example, light diffraction in an optical lithography system becomes an obstacle for further scaling down the feature size. Common techniques used to decrease the light diffraction impact include optical proximity correction (OPC), phase shift mask (PSM), and immersion optical lithography systems. When using OPC, a plurality of scanning electron microscope (SEM) images of a pattern are collected, and then the SEM images are converted to SEM contours for a contour based OPC modeling. The SEM images may be distorted, and further the associated SEM contours are also distorted. In this case, an incorrect outcome of the contour based OPC modeling is generated because of the distorted SEM contours. Accordingly, what is needed is a method addressing the above issue.

BRIEF DESCRIPTION OF THE DRAWINGS

The present disclosure is best understood from the following detailed description when read with accompanying figures. It is emphasized that, in accordance with the standard practice in the industry, various features are not drawn to scale and are used for illustration purpose only. In fact, the dimension of the various features may be arbitrarily increased or reduced for clarity of discussion.

DETAILED DESCRIPTION

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Figure 1:
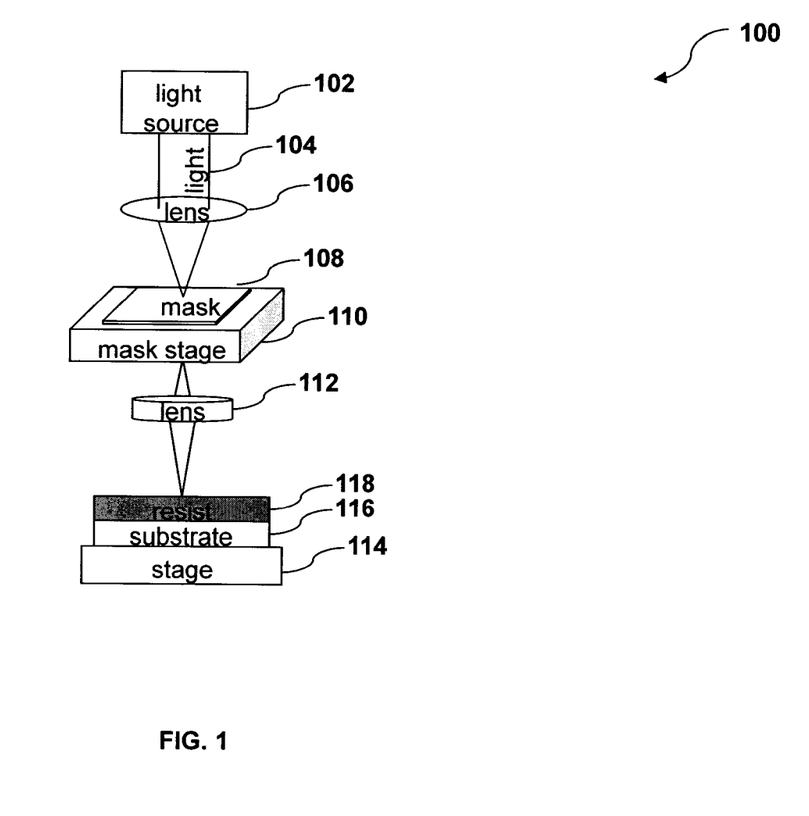
FIG. 1 is a diagram of an optical lithography system according to one or more embodiments of the present disclosure.

Referring now to FIG. 1, an optical lithography system 100 is an example of a system that can benefit from one or more embodiments of the present disclosure. The optical lithography system 100 includes a light source 102, a light 104, a condense lens 106, a photomask 108, a mask stage 110, a projection lens 112, a substrate stage 114, a substrate 116 and a resist film 118. However, other configurations and inclusion or omission of certain devices may be possible. In the present disclosure, the system 100 is also referred to as a stepper or a scanner, and the photo mask 108 is also referred to as a mask or a reticle. In the present embodiment, the light source 102 includes a radiation source providing the light 104 having a wavelength ranging from ultraviolet (UV) to deep ultra violet (DUV). For example, a mercury lamp provides UV wavelength, such as G-line (436 nm) or I-line (365 nm). As another example, an excimer laser provides DUV wavelength, such as 248 nm, 193 nm, or 157 nm. The condense lens 106 is configured to guide the light 104 to the photomask 108. The photomask 108 blocks a portion of the light 104 and provides an aerial image of the light 104 to form the patterned light 104. The photomask 108 includes a plurality of patterns (or design layout). The photomask 108 may be a binary mask (BIM), a super binary mask (SBIM), or a phase shift mask (PSM), which includes an alternative phase shift mask (alt. PSM) or an attenuated phase shift mask (att. PSM).

As shown in FIG. 1, the photo mask 108 is positioned on the mask stage 110. The mask stage 110 includes a plurality of motors, roller guides, and tables. The mask stage 110 also secures the photomask 108 on the mask stage 110 by vacuum. The mask stage 110 further provides accurate position and movement of the photomask 108 in X, Y, and Z directions during alignment, focus, leveling and exposure operation in the optical lithography system 100. The projection lens 112 includes a magnification lens for reducing the pattern image provided by the photomask 108 and guides the patterned light 104 to the resist film 118 deposited on the substrate 116 secured by the substrate stage 114. The substrate stage 114 includes motors, roller guides, and tables. The substrate stage 114 also secures the substrate 116 by vacuum. The substrate stage further provides accurate position and movement of the substrate 116 in X, Y, and Z directions during alignment, focus, leveling and exposure operations in the optical lithography system 100 so that the image of the photomask is transferred onto the substrate in a repetitive fashion (though other lithography methods are possible). The optical lithography system 100, or portions thereof, may include additional items, such as a vacuum system and/or a cooling system.

Continuing with the present embodiments, the substrate 116 deposited with the resist film 118 is loaded on the substrate stage 114 for exposure by the patterned light 104. The resist film 118 includes a positive tone resist or a negative tone resist. The substrate 116 includes a wafer substrate. The wafer substrate includes a silicon wafer. Alternatively or additionally, the wafer may include another elementary semiconductor, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP. In yet another alternative, the wafer is a semiconductor on insulator (SOI). A plurality of conductive and non-conductive thin films may be deposited on the wafer. For example, the conductive thin films may include a metal such as aluminum (Al), copper (Cu), tungsten (W), nickel (Ni), titanium (Ti), gold (Au), and platinum (Pt), or alloys thereof. The insulator film may include silicon oxide or silicon nitride.

As shown in FIG. 1, the mask 108 includes a plurality of patterns (or design layout). The design layout is transferred to the wafer substrate 116 through the mask 108 in the optical lithography system 100. With a critical dimension (CD) scaling down of the IC circuit, a light diffraction on the mask 108 may have a killing impact on a printed pattern on the wafer substrate 114. A lot of techniques are applied to minimize the light diffraction impact. For example, the lithography system 100 uses a short wave length light, such as extremely ultraviolet (EUV) light (wave length at about 13 nm) or X-ray, to expose the wafer substrate 114. The lithography system 100 also use the phase shift mask (PSM) to minimize the light diffraction impact. In another example, an optical proximity correction (OPC) technique is implemented into the mask 108 to reduce the light diffraction impact.

The OPC technique is to add a bias to a designed feature on the mask to compensate the light diffraction impact on a printed feature on the wafer substrate. The OPC technique includes a CD based OPC modeling or a contour based OPC modeling. The CD based OPC modeling adjusts size of the designed feature on the mask based on a CD measurement of a printed feature size on the wafer substrate. The contour based OPC modeling adjusts the size of the designed feature on the mask based on an image of the printed feature on the wafer substrate. A cycle time for the CD based OPC modeling is short. However, the CD based OPC modeling cannot obtain two dimension (2D) information of the feature. The contour based OPC modeling gives 2D information of the feature printed on the wafer substrate to improve the modeling accuracy. In the present embodiments, because the CD measurement or the image of the printed feature on the wafer substrate is taken on a scanning electron microscope (SEM), an image is also referred to as a SEM image, and a CD is also referred to as a SEM CD.

Continuing the discussion in the present embodiments, the OPC modeling using the SEM CD measurement or the SEM image of the printed feature on the wafer substrate to adjust the designed feature on the mask. If the SEM image is distorted, the incorrect information is fed back for the OPC modeling, and further a wrong adjustment is made to the designed feature on the mask based on the incorrect information. A SEM image or a SEM contour calibration is needed for the contour based OPC modeling.

Figure 2:
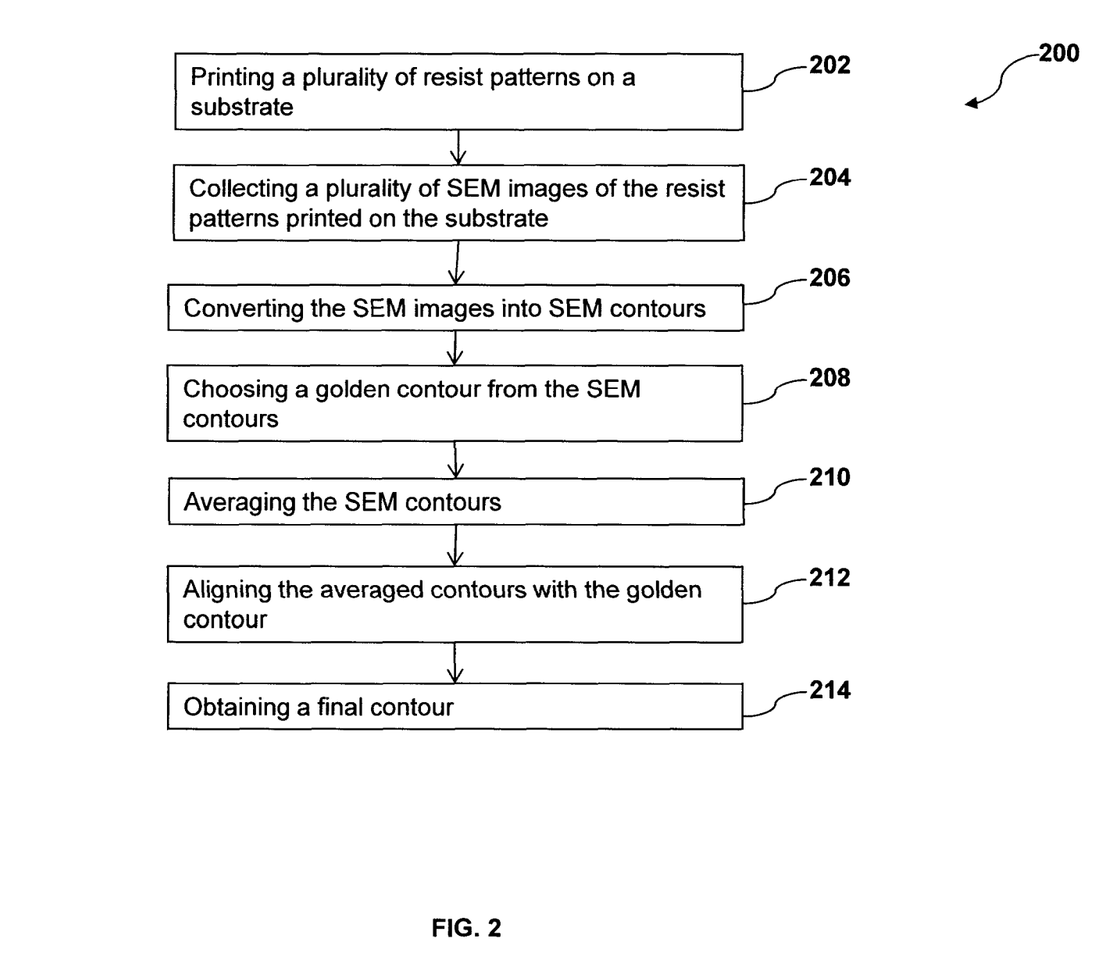
FIG. 2 is a flow chart of a method of calibrating a scanning electron microscope (SEM) contour for implementing one or more embodiments of the present disclosure.

Referring now to FIG. 2, a flow chart of a method 200 of calibrating a SEM contour is illustrated according one or more embodiments of the present disclosure. The method 200 begins at step 202 by printing a plurality of resist patterns on a substrate using the optical lithography system 100 as shown in FIG. 1. The step 202 may include deposing a resist film on the substrate, for example, by a spin-on coating process. The step 202 may include performing a dehydration process before applying the resist film on the substrate, which can enhance an adhesion of the resist film to the substrate. The dehydration process may include baking the substrate at a high temperature for a duration of time, or applying a chemical such as hexamethyldisilizane (HMDS) to the substrate. The operation 202 may also include a soft bake (SB), which can increase a necessary mechanical strength of the resist film. The step 202 further includes exposing the resist film deposited on the substrate by the optical lithography system 100. The step 202 furthermore includes applying a developer to the exposed resist film deposited on the substrate to form the resist pattern on the substrate. The step 202 may also include a post expose bake (PEB) before applying the developer to the exposed resist film deposited on the substrate, a post develop bake (PDB) after applying the developer to the exposed resist film deposited on the substrate, or both.

As shown in FIG. 2, the method 200 proceeds to step 204 by collecting the SEM images of the resist pattern on the substrate. The SEM image is a top-down view SEM image of a resist pattern profile with reference to FIG. 7 below. The step 204 also includes performing the SEM CD measurement on the resist pattern. The method 200 proceeds to step 206 by converting the SEM image of the resist pattern to a SEM contour of the resist pattern using an image processing program. The SEM contour outlines the boundary line of the SEM image with reference to FIG. 6 below. The method 200 proceeds to step 208 by choosing a golden contour from a plurality of the SEM contours of the resist pattern. In the depicted embodiment, the golden contour is chosen by an experienced human user, for example, a technician, or an engineer. The experienced human user chooses what he or she believes to be the "best" contour based on the experience. The method 200 proceeds to step 210 by averaging the SEM contours of the resist pattern. The method 200 proceeds to step 212 by aligning the averaged contour of the resist pattern with the golden contour. The method 200 proceeds to step 214 by obtaining a final contour of the resist pattern. The step 214 also includes providing the final contour for a contour based OPC modeling. Additional steps can be provided before, during, and after the method 200, and some the steps described can be replaced, eliminated, or moved around for additional embodiments of the method 200

As shown in method 200, the SEM contours are averaged and aligned based on the golden contour determined by the experienced human user, the final contour (result) will be changed due to the choice or preference of the golden contour. Further, the method 200 cannot measure the in situ distortion parameters of the SEM contour during each measurement. Furthermore, the method 200 cannot handle the contour distortion of asymmetrical patterns.

Figure 3:
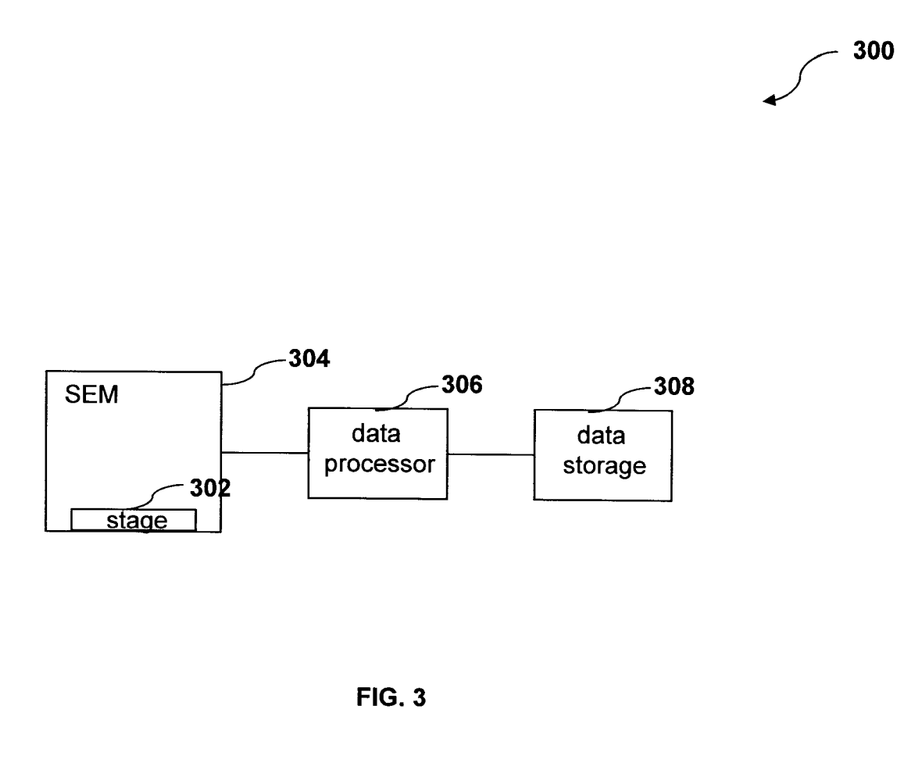
FIG. 3 is a set for calibrating a SEM contour for implementing one or more embodiments of the present disclosure.

Referring now to FIG. 3, a setup 300 of calibrating a SEM contour is illustrated for implementing one or more embodiments of the present disclosure. The setup 300 includes a substrate 302, a SEM system 304, a data processor 306, and a data storage 308. However, other configurations and inclusion or omission of the setup 300 may be possible. The substrate 302 includes a plurality of resist patterns. The resist patterns provide the SEM CD or the SEM images for the contour calibration. The SEM system 304 includes an electron gun, condenser lenses, defection coils, a substrate stage, a vacuum pump, and an electron detector. A beam of electrons emitted from the electron gun travels through the condenser lenses, and the deflection coils and is projected on the substrate 302. A secondary electrons generated from the substrate 302 are detected by the electron detector and provides image information of the pattern on the substrate 302. The substrate stage holds the substrate and provides motion in x, y or z directions during the measurement. The vacuum pump provides a high vacuum environment for the measurement.

The data processor 306 includes a computer. The data processor 306 can convert the secondary electrons detected by the electron detector to an SEM image of the resist pattern and further convert the image of the resist pattern to a SEM contour of the resist pattern. The data processor 306 also includes a computer operating the SEM system 304 during the measurement. The data storage 308 includes a hard drive or other memory device to store the image and the contour of the resist pattern.

Figure 4:
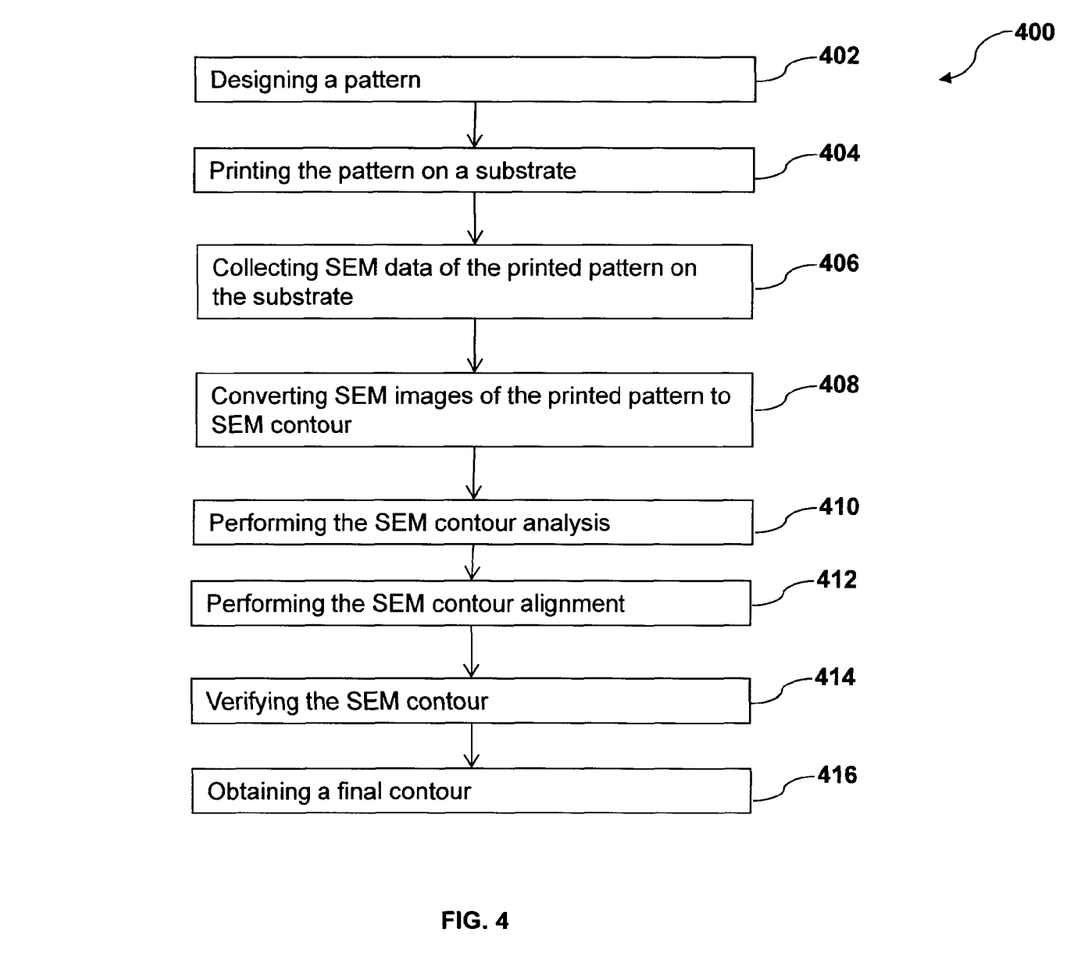
FIG. 4 is a flow chart of a method of calibrating a SEM contour for implementing one or more embodiments of the present disclosure.

Referring now to FIG. 4, a flow chart of a method 400 using the setup 300 is illustrated for benefiting one or more embodiments of the present disclosure. The method 400 begins at step 402 by designing a pattern on a mask. The pattern includes an anchor pattern, a verification pattern, a symmetrical pattern, an asymmetrical pattern, or a combination thereof. The step 402 includes fabricating the mask having the pattern in a mask shop or a mask manufacture facility. The method 400 proceeds to step 404 by printing the pattern on a substrate. The step 404 includes depositing a resist film on the substrate, for example, by a spin-on coating process, exposing the resist film deposited on the substrate using an exposing tool, and developing the exposed resist film to form a printed pattern on the substrate. The printed pattern on the substrate includes a printed anchor pattern and a printed verification pattern on the substrate. The substrate may include a silicon wafer, or other material wafer.

As shown in FIG. 4, the method 400 proceeds to step 406 by collecting SEM data of the printed pattern on the substrate using the setup 300 as shown in FIG. 3. The step 406 includes measuring SEM CD of the printed pattern on the substrate and taking SEM images of the printed pattern on the substrate. The method 400 proceeds to step 408 by converting the SEM images of the printed pattern to SEM contours of the printed pattern using the data processor 306 of the setup 300 as shown in FIG. 3. The method 400 proceeds to step 410 by performing a SEM contour analysis using the data process 306 as shown in FIG. 3. The step 410 includes designing an alignment gauge or a searching box along a normal line of the SEM contour. The step 410 also includes measuring a distance between the SEM contour and the associated anchor pattern along the normal direction using the alignment gauge or the searching box as shown in FIGS. 5-6.

Figure 5:
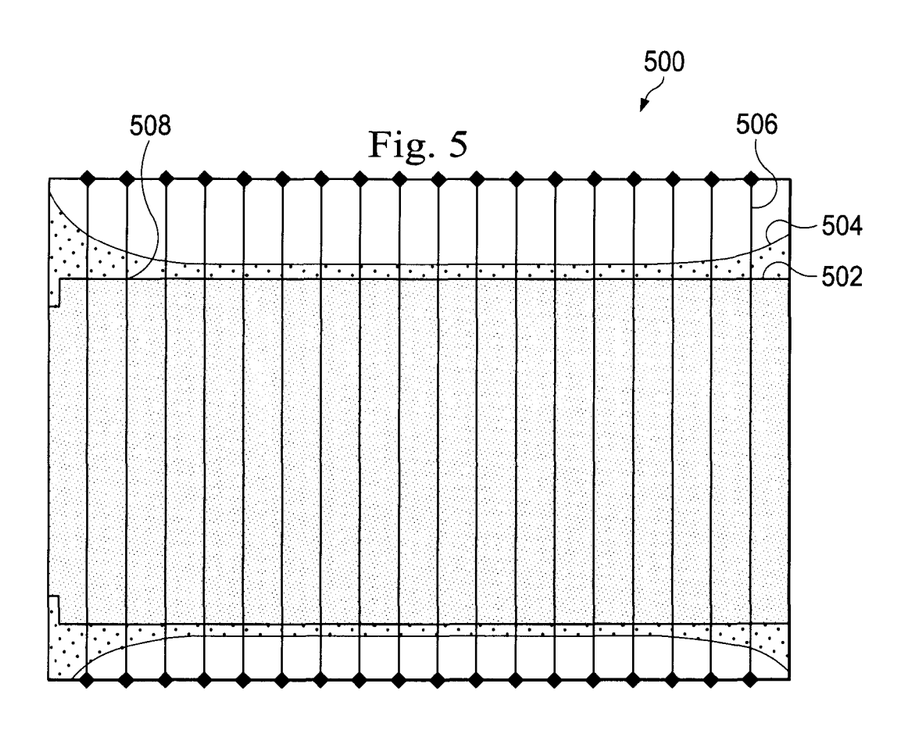
FIGS. 5-6 are examples of calibrating a SEM contour for implementing one or more embodiments of the present disclosure.

FIG. 5 is an example 500 of measuring the distance between the SEM contour and the associated anchor pattern using the alignment gauge according to one or more embodiments. The example 500 includes an anchor pattern 502, a SEM contour 504, a plurality of alignment gauges 506 and a plurality of contour points 508. The anchor pattern 502 is a designed pattern on a mask. In the depicted embodiments, an anchor pattern is also referred to as a design on mask (DOM). The SEM contour 504 is converted from a SEM image of the anchor pattern 502 printed on the substrate. The alignment gauges 506 are divided the SEM contour 504 at the contour points. A distance between two adjacent contour points ranges from approximate 10 to 20 nm. Ai is the distance between the ith contour point of the SEM contour 504 and the associated edge of the anchor pattern 502.

Figure 6:
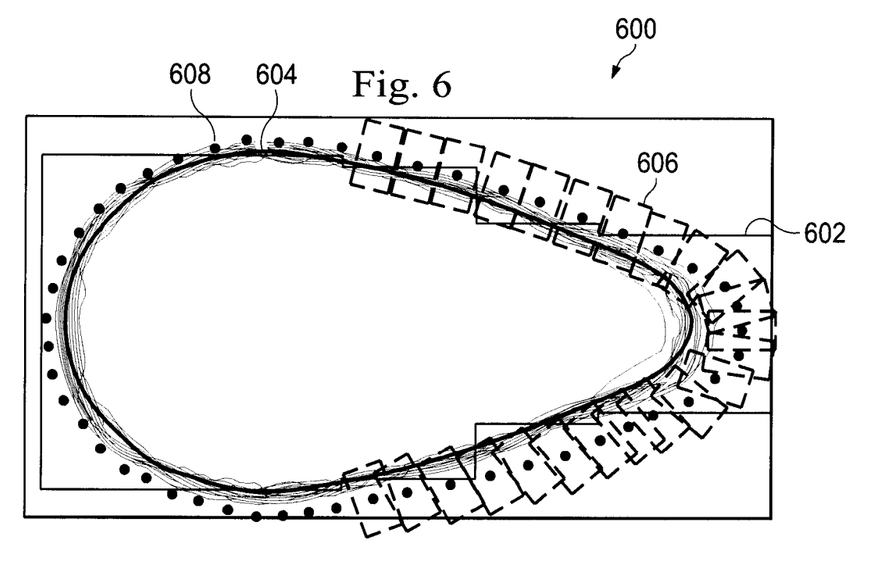

FIG. 6 is an example 600 of measuring the distance between the SEM contour and the associated anchor pattern using the searching box according to one or more embodiments. The example 600 includes an anchor pattern 602, a SEM contour 604, a plurality of searching boxes 606 and a plurality of contour points 608. The anchor pattern 602 is a designed pattern on a mask. The SEM contour 604 is converted from a SEM image of the anchor pattern 602 printed on the substrate. The searching box 606 is divided an edge of the SEM contour 604. A center of the searching box 606 is superimposed with the contour point 608 along the edge of the SEM contour 604. A dimension of the searching box 606 in the normal direction of the contour point 608 is designed to remove outlier data of the measured SEM contour 604. In one embodiment, for example, the dimension of the searching box 606 is approximately 100 nm in normal direction of the contour point 608. A dimension of the searching box 606 in a direction perpendicular to the normal direction of the contour points 608 is the same as the distance between two adjacent contour points 608, for example, ranging from approximately 10 to 20 nm. As shown in FIG. 6, Ai is the distance between the ith contour point of the SEM contour 604 and the associated edge of the anchor pattern. The Ai can be further divided into in x direction Ai,x and in y direction Ai,y.

Referring back to FIG. 4, the step 410 of the method 400 also includes applying a regression algorithm to calculate a plurality of distortion parameters of a SEM contour using the distance Ai (Ai,x and Ai,y) between the contour point of the SEM contour and the associated edge of the anchor pattern. The distortion parameters of the SEM include a placement shift in a X/Y direction, a rotation, or a scaling (a magnification) in the X/Y direction. The step 412 also includes using a geometry center of a symmetric anchor pattern or a pitch of a symmetric anchor pattern by applying regression algorithms to calculate the distortion parameters of the SEM contour.

The method 400 proceeds to step 412 by performing a SEM contour alignment. The step 414 includes aligning the SEM contour to the anchor pattern. The step 414 also includes minimizing the distance between the SEM contour and the anchor pattern by adjusting the SEM contour using the distortion parameters of the SEM contour. For a symmetric anchor pattern, the step 414 includes adjusting both side of the SEM contour with the same size to minimize the distance between the SEM contour and the anchor pattern. For an asymmetric anchor pattern, the step 414 also includes using pitch of the asymmetric anchor pattern to adjust the pitch of the SEM contour.

Figure 7:
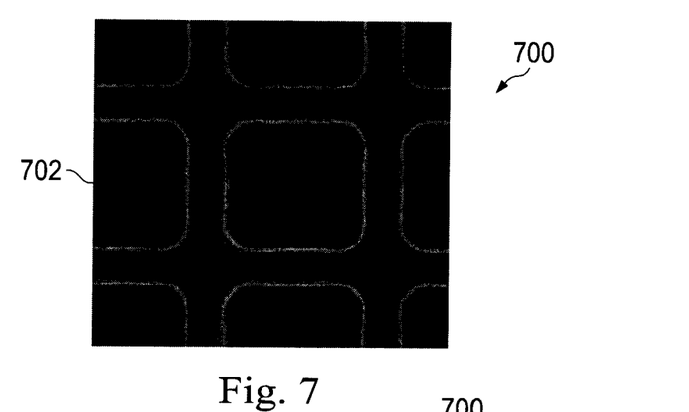
FIGS. 7-9 are examples of calibrating a SEM contour for implementing one or more embodiments of the present disclosure.
Figure 8:
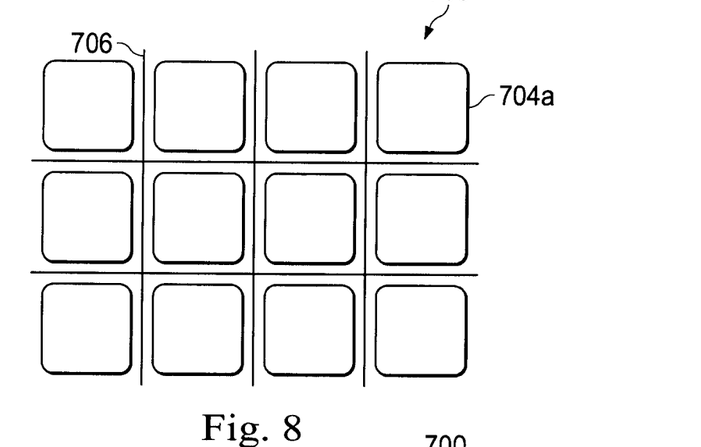
Figure 9:
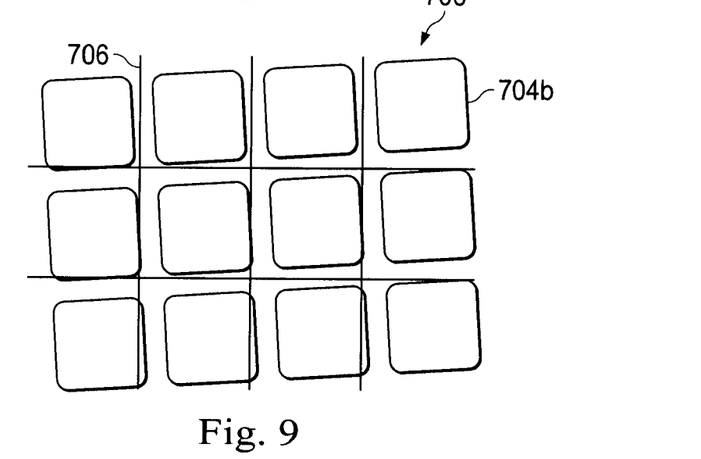

The method 400 proceeds to step 414 by verifying the SEM contour alignment as shown in FIGS. 7-9. The step 414 includes using a verification pattern with a constant pitch to obtain in situ image distortion parameters. The step 414 includes obtaining a SEM image 702 of the verification pattern printed on a wafer substrate as shown in FIG. 7. The step 414 also includes converting the SEM image 702 to a SEM contour 704a. The step 414 further includes aligning the SEM contour 704a to an alignment grid 706 as shown in FIG. 8. The alignment grid 706 is obtained by a linear fitting the straight lines of the verification pattern. The step 414 furthermore includes obtaining the in situ image distortion parameters, such as a placement shift in X/Y direction, a rotation, or a scaling (or a magnification) in X/Y direction as shown in FIG. 9. The image distortion parameters can be measured by analyzing a pitch difference and a tilt angle between the SEM contour 704b and the alignment grid 706.

Figure 10:
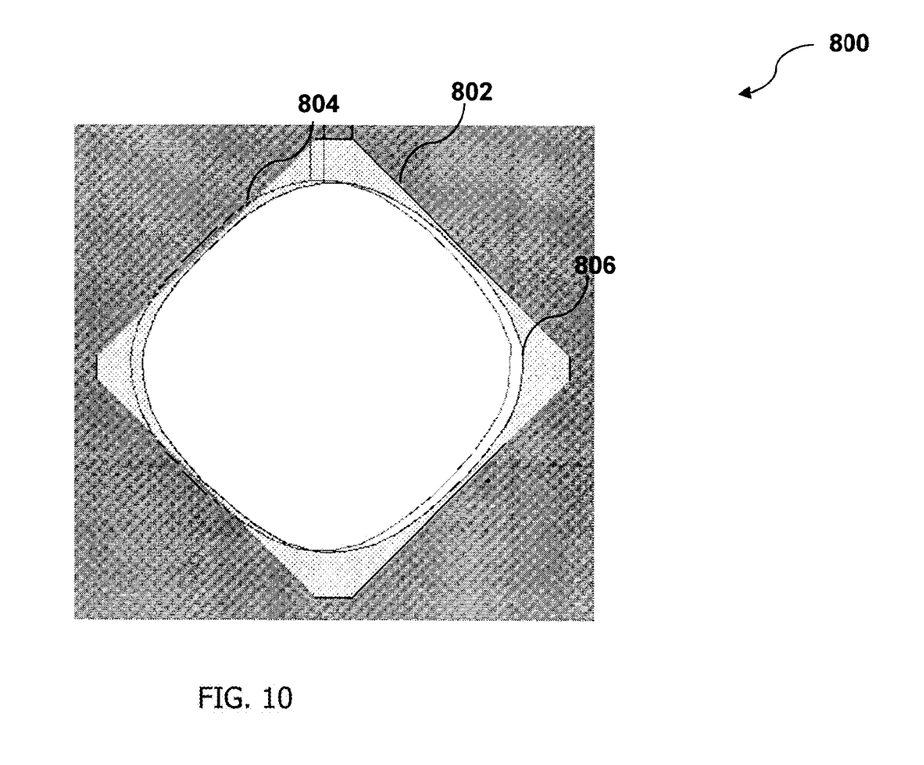
FIG. 10 is an example of calibrating a SEM contour for implementing one or more embodiments of the present disclosure.

The method 400 proceeds to step 416 by obtaining a final contour of a SEM image as shown in FIG. 10. An anchor pattern 802 is printed on a wafer substrate. An original SEM contour 804 is obtained from a SEM image of the anchor pattern 802 printed on the wafer substrate. After performing the SEM contour analysis and the SEM contour alignment, a calibrated contour 806 is obtained. In one embodiment, the step 416 includes providing the calibrated SEM contour 806 for an OPC modeling. In another embodiment, the step 416 includes providing the calibrated SEM contour 806 for mask or wafer defect inspection. In some embodiments, the step 416 also includes providing the calibrated SEM contour 806 for an optical exposing tool calibration. The step 416 further includes providing the calibrated SEM contour 806 for a mask or a wafer measurement calibration. Additional steps can be provided before, during, and after the method 400, and some the steps described can be replaced, eliminated, or moved around for additional embodiments of the method 400.

Thus, the present disclosure describes a method of forming a contour. The method includes designing a pattern, wherein the pattern include an designed anchor pattern and a designed verification pattern, printing the pattern on a substrate, collecting scanning electron microscope (SEM) data of the printed anchor pattern on the substrate, wherein the SEM data includes a SEM image of the printed anchor pattern on the substrate, converting the SEM image of the printed anchor pattern on the substrate into a SEM contour of the printed anchor pattern, analyzing the SEM contour of the printed anchor pattern, and aligning the SEM contour of the anchor pattern.

Analyzing the SEM contour of the printed anchor pattern includes measuring a distance between the SEM contour of the printed anchor pattern and the designed anchor pattern at a contour point. Analyzing the SEM contour of the printed anchor pattern further also includes calculating a plurality of distortion parameters of the SEM contour of the printed anchor pattern using the distance between the SEM contour of the printed anchor pattern and the designed anchor pattern at a contour point.

Calculating the distortion parameters of the SEM contour includes calculating displacement, scale, or rotation of the SEM contour of the printed anchor pattern. Calculating the distortion parameters of the SEM contour further includes using a regression algorithm to calculate the distortion parameters of the SEM contour. Aligning the SEM contour of the printed anchor pattern includes correcting the SEM contour of the printed anchor pattern by using the calculated distortion parameters so that a corrected SEM contour of the printed anchor pattern is generated.

Correcting the SEM contour of the printed anchor pattern includes shifting, scaling, or rotating the SEM contour of the anchor pattern, or combination thereof. Correcting the SEM contour of the printed anchor pattern includes minimizing the distance between the SEM contour of the printed anchor pattern and the designed anchor pattern at the contour point. The method further includes verifying the corrected SEM contour using the designed verification pattern.

Verifying the corrected SEM contour includes aligning a printed verification pattern to the designed verification pattern. Verifying the corrected SEM contour further includes obtaining in situ distortion parameters of the SEM contour of the printed verification pattern. Verifying the corrected SEM contour further includes confirming the calculated distortion parameters of the SEM contour of the printed anchor pattern by using the in site distortion parameters. The method further includes providing the corrected SEM contour od the printed anchor pattern for an optical proximity correction modeling, an exposure tool calibration, a wafer or a mask defect inspection, or the wafer or the mask critical dimension (CD) measurement.

In other embodiments, the method includes designing a pattern, wherein the pattern include an designed anchor pattern and a designed verification pattern, printing the pattern on a substrate using an exposure tool, collecting a scanning electron microscope (SEM) image of the printed anchor pattern on the substrate, converting the SEM image of the printed anchor pattern on the substrate into a SEM contour of the printed anchor pattern, analyzing the SEM contour of the printed anchor pattern, and aligning the SEM contour of the printed anchor pattern. Analyzing the SEM contour of the printed anchor pattern includes calculating a plurality of distortion parameters of the SEM contour of the printed anchor pattern. Aligning the SEM contour of the printed anchor pattern includes correcting the SEM contour of the printed anchor pattern using the calculated distortion parameters so that a corrected SEM contour of the printed anchor pattern is generated. The method further includes verifying the corrected SEM contour of the printed anchor pattern by a printed verification pattern on the wafer.

The method further includes providing the corrected SEM contour of the printed anchor pattern for an optical proximity correction modeling, an exposure tool calibration, a wafer or a mask defect inspection, or the wafer or the mask critical dimension (CD) measurement. Calculating the distortion parameters includes calculating displacement, scaling, or rotation of the SEM contour of the printed anchor pattern by using a regression algorithm. Correcting the SEM contour of the printed anchor pattern includes shifting, scaling, or rotating the SEM contour of the printed anchor pattern so that a distance between the SEM contour of the printed anchor pattern and the designed anchor pattern at the contour point is minimized In some embodiments, a setup for calibrating a contour is described. The setup includes a substrate having a printed pattern, a scanning electron microscope (SEM) holding the substrate, a data processor connecting the SEM, and a data storage connecting the data processor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of calibrating a contour, the method performed by a data processor, the method comprising:
    with the data processor, designing a pattern, wherein the pattern includes a designed anchor pattern and a designed verification pattern to be printed onto a substrate;
    collecting scanning electron microscope (SEM) data of a printed anchor pattern on the substrate, wherein the SEM data includes a SEM image of the printed anchor pattern on the substrate;
    converting the SEM image of the printed anchor pattern on the substrate into a SEM contour of the printed anchor pattern;
    analyzing the SEM contour of the printed anchor pattern, wherein analyzing the SEM contour of the printed anchor pattern includes measuring a distance between the SEM contour of the printed anchor pattern and the designed anchor pattern at a contour point; and
    aligning the SEM contour of the anchor pattern, to calibrate the SEM contour.

2. The method of claim 1, further comprising calculating a plurality of distortion parameters of the SEM contour of the printed anchor pattern using the distance between the SEM contour of the printed anchor pattern and the designed anchor pattern at a contour point.

3. The method of claim 2, wherein calculating the distortion parameters of the SEM contour includes calculating displacement, scale, or rotation of the SEM contour of the printed anchor pattern.

4. The method of claim 3, further comprising using a regression algorithm to calculate the distortion parameters of the SEM contour.

5. The method of claim 1, wherein aligning the SEM contour of the printed anchor pattern includes correcting the SEM contour of the printed anchor pattern by using the calculated distortion parameters so that a corrected SEM contour of the printed anchor pattern is generated.

6. The method of claim 5, wherein correcting the SEM contour of the printed anchor pattern includes shifting, scaling, or rotating the SEM contour of the anchor pattern, or combination thereof.

7. The method of claim 6, further comprising minimizing a distance between the SEM contour of the printed anchor pattern and the designed anchor pattern at the contour point.

8. The method of claim 5, further comprising verifying the corrected SEM contour using the designed verification pattern.

9. The method of claim 8, wherein verifying the corrected SEM contour includes aligning a printed verification pattern to the designed verification pattern.

10. The method of claim 9, further comprising obtaining in situ distortion parameters of the SEM contour of the printed verification pattern.

11. The method of claim 10, further comprising confirming the calculated distortion parameters of the SEM contour of the printed anchor pattern by using the in site distortion parameters.

12. The method of claim 1, further comprising providing a corrected SEM contour of the printed anchor pattern for an optical proximity correction modeling, a mask process correction modeling, an exposure tool calibration, a wafer or a mask defect inspection, or the wafer or the mask critical dimension (CD) measurement.

13. A method of calibrating a contour, the method performed by a data processor, the method comprising:
with the data processor, designing a pattern, wherein the pattern include a designed anchor pattern and a designed verification pattern to be printed on a substrate;
collecting scanning electron microscope (SEM) data of a printed anchor pattern on a substrate, wherein the SEM data includes a SEM image of the printed anchor pattern on the substrate;
converting the SEM image of the printed anchor pattern on the substrate into a SEM contour of the printed anchor pattern;
analyzing the SEM contour of the printed anchor pattern, wherein analyzing the SEM contour of the printed anchor pattern includes calculating a plurality of distortion parameters of the SEM contour of the printed anchor pattern; and
aligning the SEM contour of the printed anchor pattern, wherein aligning the SEM contour of the printed anchor pattern includes correcting the SEM contour of the printed anchor pattern using the calculated distortion parameters so that a calibrated SEM contour of the printed anchor pattern is generated.

14. The method of claim 13, further compromising verifying the calibrated SEM contour of the printed anchor pattern by a printed verification pattern on the wafer.

15. The method of claim 13, further comprising providing the calibrated SEM contour of the printed anchor pattern for an optical proximity correction modeling, an exposure tool calibration, a wafer or a mask defect inspection, or the wafer or the mask critical dimension (CD) measurement.

16. The method of claim 13, wherein calculating the distortion parameters includes calculating displacement, scaling, or rotation of the SEM contour of the printed anchor pattern by using a regression algorithm.

17. The method of claim 13, wherein correcting the SEM contour of the printed anchor pattern includes shifting, scaling, or rotating the SEM contour of the printed anchor pattern so that a distance between the SEM contour of the printed anchor pattern and the designed anchor pattern at the contour point is minimized.

18. A setup for calibrating a contour, the setup comprising:
a substrate having a printed anchor pattern, wherein the printed pattern is obtained using a mask having a designed pattern;
a scanning electron microscope (SEM) holding the substrate, wherein the SEM is configured to take a SEM image of the printed anchor pattern;
a data processor coupled to the SEM, wherein to calibrate the contour, the data processor is configured to convert the SEM image of the printed anchor pattern to a SEM contour, analyze the SEM contour, correct the SEM contour to the designed pattern, and verify the corrected SEM contour, and provide a corrected SEM contour of the printed anchor pattern for an optical proximity correction modeling, a mask process correction modeling, an exposure tool calibration, a wafer or a mask defect inspection, or the wafer or the mask critical dimension (CD) measurement; and
a data storage connecting the data processor, wherein the data storage include storing the SEM image and SEM contour;
wherein the designed pattern includes a designed anchor pattern and a designed verification pattern.

19. The setup of claim 18, wherein to analyze the SEM contour, the data processor is configured to calculate distortion parameters by calculating displacement, scaling, or rotation of the SEM contour of the printed anchor pattern by using a regression algorithm.

20. The setup of claim 18, wherein to correct the SEM contour of the printed anchor pattern, the data processor is configured to shift, scale, or rotate the SEM contour of the printed anchor pattern so that a distance between the SEM contour of the printed anchor pattern and the designed anchor pattern at the contour point is minimized.

* * * * *